United States Patent [19]
Yoshino et al.

[11] Patent Number: 5,673,135
[45] Date of Patent: Sep. 30, 1997

[54] SCANNING PROJECTION OPTICAL DEVICE

[75] Inventors: Hisakazu Yoshino; Takuji Satoh; Toshiki Okumura, all of Tokyo, Japan

[73] Assignee: Kabushiki Kaisha Topcon, Tokyo, Japan

[21] Appl. No.: 762,985

[22] Filed: Dec. 10, 1996

Related U.S. Application Data

[63] Continuation of Ser. No. 288,713, Aug. 15, 1994, abandoned.

[30] Foreign Application Priority Data

Aug. 17, 1993 [JP] Japan .................................. 5-203413

[51] Int. Cl.$^6$ ........................................... G02B 26/08
[52] U.S. Cl. .......................... 359/196; 359/727; 359/733; 359/736
[58] Field of Search ......................... 359/196, 201, 359/202, 208, 649, 726–727, 663, 730–736; 358/474, 493–494, 496–497, 296; 355/228–234

[56] References Cited

U.S. PATENT DOCUMENTS

| | | |
|---|---|---|
| 3,748,015 | 7/1973 | Offner . |
| 5,369,521 | 11/1994 | Yoshino ................................. 359/196 |
| 5,448,416 | 9/1995 | Okumura et al. ....................... 359/727 |

FOREIGN PATENT DOCUMENTS 57-51083  10/1982  Japan .

OTHER PUBLICATIONS

J. Dyson, "Unit Magnification Optical System without Seidel Aberrations," *The Optical Society of America*, vol. 49, No. 7, pp. 713–716 (Jul. 1959).

*Primary Examiner*—James Phan
*Attorney, Agent, or Firm*—Reid & Priest LLP

[57] ABSTRACT

A scanning projection optical device is disclosed which can be constructed using relatively small optical members, which employs a catadioptric system that is advantageous to attain a high NA, and which has arc-shaped object and image regions located out of an optical axis and a projecting magnification of 1. In the scanning projection optical device, the catadioptric system is an optical system telecentric in both object- and image- field sections, and has a first, positive power lens-system, a second, substantially non-power lens-system, and a concave mirror; the first, positive power lens-system and the concave mirror cooperatively satisfy Petzval condition to correct field curvature; and without impairing the Petzval condition satisfied by the first lens-system and the concave mirror, the second lens-system corrects aberration of the arc-shaped region centering around the optical axis.

4 Claims, 11 Drawing Sheets

10.4"

6"

SCANNING PROJECTION OPTICAL DEVICE

This is a continuation of U.S. application Ser. No. 08/288,713, filed Aug. 15, 1994, abandoned.

BACKGROUND OF THE INVENTION

1. Field of the Invention

The present invention relates to a scanning projection optical device having a broad field and projecting with high resolving power.

2. Description of the Prior Art

As a representative example of conventional projection optical systems projecting with high resolving power, there has been known a stepper which adopts a step-exposure mode which comprises, by means of a dioptric system, dividing an object whose image is to be projected into a plurality of sections, and sequentially subjecting each of the sections to exposure to effect projection. Such a stepper is capable of scaling up and down and enables a high numerical aperture (NA) to be attained. The step-exposure mode is a mode which effects exposure by means of one dioptric projection lens. Such a dioptric projection lens is designed to have a magnifying power of projection of 1 so as to ensure a broad field, i.e., a broad exposure area.

As regards the projection lens, however, an area acceptable in abaxial aberration is restricted to an extent of 150×150 mm$^2$ around the optical axis. Accordingly, the projection lens is unsatisfactory when used to expose a field industrially desired, for example, a panel of 10.4 inches. In this case, an exposure area having shorter sides of 10.4 inches is divided into quarters as shown in FIG. 14, or an exposure area having shorter sides of 6 inches is divided into halves as shown in FIG. 15, and each of the resulting divisions is sequentially subjected to exposure to effect projection. In FIGS. 14 and 15, the divisions A to D (or A to B) are masks (whose images are to be projected) which may be different from each other. Therefore, use of this mode enables a broad field to be exposed by employing a large scanning stroke of a scanning table.

On the other hand, the step-exposure mode has problems in that masks must be replaced exposure to exposure, and that joints in the exposure area are unwantedly awkward. The joint-related problem can be solved to some extent by improving precision in junctional alignment between the exposure divisions during exposure. However, in view of prospective tendency of crystal panels to grow more precise and larger, joints in the exposure area will be likely to be unwantedly awkward, thereby making difficulty in production of large-sized liquid crystal panel displays. Further, exposure must be conducted mask-to-mask, leading to a prolonged exposure time, namely, lowered throughput. This is undesirable from the viewpoint of operational efficiency.

As a mode to solve the drawback of the stepper mode, a scanning catoptric projection mode having high resolving power and a broad field has been known. An optical system employing a scanning catoptric projection mode is disclosed in Japanese Patent Publication No. 51083/1982 (U.S. Pat. No. 3,748,015), and the optical system comprises a concave mirror 100 and a convex mirror 102 which are oppositely disposed as shown in FIG. 11. In this optical system, an object and its image are symmetrically positioned relative to an optical axis 104, and an annular aberration-corrected region 106 in which aberration is corrected is formed around the optical axis 104. A beam used for projection is only a beam which passes through the aberration-corrected region 106 limited by a field stop (not shown) in a lighting system located at a position conjugate to the position of the object. Scanning is conducted by synchronously moving a projective object located at the object-position and a sensitized material at the imaging position, relative to the projection system.

The catoptric projection mode is characterized in that the aberration-corrected region 106 located at a certain level from the optical axis is used as shown in FIG. 11. The aberration-corrected region 106 is an arc-shaped region as shown in FIG. 12, and the position thereof is univocally determined by curvature radii of the two mirrors 100, 102 and configurational condition thereof. Practically, larger curvature radii of the concave and convex mirrors are rather employed to attain a larger arc-width of exposure.

When a 10.4-inch panel as shown in FIG. 14 is exposed in the catoptric projection mode, a span 1 of the arc shown in FIG. 12 is selected in the direction of the shorter side of 10.4 inches. In this case, however, the panel is exposed only in the arc-width W in the longitudinal direction. Accordingly, the mask and the substrate (sensitized material) are synchronized to expose the entire area of the panel.

According to this mode, since a mask need not be replaced and the problem in the stepper mode caused by the joints between the masks is eliminated, highly precise exposure can be attained, thereby enabling a large-sized liquid crystal panel to be produced.

To deal with a prospective liquid crystal panel with high precision which has a large picture plane of 10.4 inches or more, the stepper mode has no choice but to increase number of divisions because of limited exposure area of up to about 150×150 mm2. It follows that joints between masks are likely to be more attractive unwantedly, and that throughput tends to decrease.

On the other hand, the scanning catoptric projection mode is free from the two problems of "joints between masks" and "lowering in throughput due to replacement of masks" which are predictable with respect to the stepper mode, and is capable of coping with the demand for a broad field with high resolution. Thus, it is the practical point of the matter how to realize an optical system designed to have a longer arc-span 1 and a larger arc-width W.

Among conventional techniques, a dioptric system has been used as a high resolution system, and a catoptric system has been used as a broad field system.

The latter optical system to attain exposure in a broad field has a problem in that the system is large in size. The reason for the large size of the catoptric system to attain exposure in a broad field is as follows. The diameter of the concave mirror as a large-sized reflecting member shown in FIG. 11 is determined by the curvature radius of the concave surface of the concave mirror, height of an image, and numerical aperture (NA) of optical system per se. A beam directed into this catoptric system divergingly travels from the object-position 106 toward the concave mirror 100 at NA. In this case, the distance L between the concave mirror 100 as a first optical member and object-position (image-position) 106 is the full length of the optical system. It follows as an inevitable consequence that the size of the optical system is large. Besides, when a larger arc-width W is intended, the curvature radius of the concave mirror tends to be large, thereby leading to a further large size. Therefore, when the catoptric system is employed, technical problem resides in how to produce such a large-sized concave mirror 100 with high precision and how to maintain the precision.

On the other hand, Consideration will be given to influences of distortions of the catoptric member and the dioptric member on aberration.

Aberrations caused by maximum distortions Pv of optical members are:

2×Pv—with respect to distortion of the catoptric member, and (n−1)×Pv—with respect to distortion of the dioptric member wherein n represents a refractive index of the lens and generally n=1.5.

Therefore, aberration caused by the dioptric member is (0.5×Pv) which corresponds to ¼ of the influence caused by the catoptric member. Consequently, it is advantageous for attaining broad field exposure with a large-sized optical member to use a dioptric member.

Further, if a catoptric member were used to attain a high NA, it would be impossible to attain a high NA because the beam is shaded by the convex mirror 102 in the catoptric system shown in FIG. 11.

SUMMARY OF THE INVENTION

The present invention has been made in view of the above-mentioned problems, and therefore, it is an object of the present invention to provide a scanning projection optical device which can be constructed using relatively small optical members, which employs a catadioptric system that is advantageous to attain a high NA, and which has arc-shaped object and image regions located out of an optical axis and a projecting magnification of 1.

It is a further object of the present invention to provide a scanning projection optical device which is capable of readily correcting Seidel's five aberrations and chromatic aberration, which can advantageously be used for exposure of, e.g., a 20-inch flat panel display that requires a resolving power of 278 mm, i.e., a resolving power as high as a several μm.

According to the present invention, there is provided scanning projection optical device, which projects an object by scanning with a predetermined scanning width, comprising:

an illuminator for illuminating the object upon an arc-shaped region, a catadioptric system for forming on an image plane an image of the object illuminated on the arc-shaped region by the illuminator, photosensitive members located in the object plane and the image plane, and a driving device for relatively moving the illuminator and the catadioptric system in the direction perpendicular to the direction of the illumination, wherein said catadioptric system is an optical system telecentric in both object- and image- field sections, and has a first, positive power lens-system, a second, substantially non-power lens-system, and a concave mirror;

said first, positive power lens-system and said concave mirror cooperatively satisfy Petzval condition to correct field curvature; and without impairing the Petzcal condition satisfied by the first lens-system and the concave mirror, said second lens-system corrects aberration of the arc-shaped region centering around the optical axis.

DETAILED DESCRIPTION OF THE PREFERRED EMBODIMENTS

Figure 2:
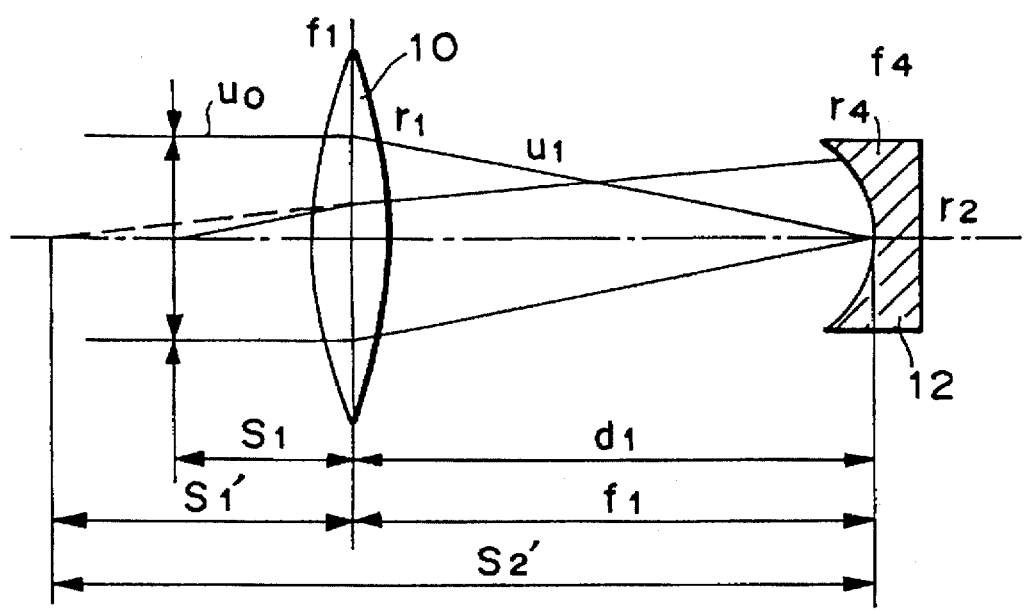
FIG. 2 is an optical diagram for illustrating principle of the present invention.

In the catadioptric shown in FIG. 2 which comprises a thin lens and a spherical mirror, it is required for forming a telecentric system that when the incident angle u0 of the principal ray entering into the thin lens 10 having a focal length of f1 is 0, the incident level of the principal ray h2 impinging upon the spherical mirror 12 having a focal length of f4 is 0. From this, the distance d1 between the thin lens 10 and the spherical mirror 12 is f1, i.e., d1=f1.

On the other hand, to set the Petzval sum to be 0 to correct field curvature, the following relation is required to be satisfied.

$$\Sigma Pv = 1/f1n1 + 1/f4 + 1/f1n1 = 2/f1n1 + 1/f4 = 0 \qquad (1)$$

Taking into consideration the fact that the focal length f4 of the spherical mirror 12 is represented by the formula f4=r4/2 wherein r4 is the curvature radius of the spherical mirror 12, the curvature radius r4 of the spherical mirror is as follows.

$$r4 = -n1f1 \qquad (2)$$

From the equation (2), the spherical mirror 12 is found to be a concave mirror.

Then, the object distance s1 will be found. First, from the conjugate relationship between the object-position and the image-position of the spherical mirror 12, the following relation is satisfied.

$s2=s2'=r4$

From FIG. 2, the image distance s1 of the thin lens is as follows.

$s1'=r4+f1$

Taking the equation (2) into consideration, the following relation is obtained.

$$s1'=(1-n1)f1 \tag{3}$$

From the imagery relationship by the thin lens having a focal length of f1, the following relation is provided.

$$1/s1=1/s1'-1/f1 \tag{4}$$

Finally, the following relation is obtained from the equations (3) and (4).

$$s1=(1-n1)f1/n1 \tag{5}$$

The equation (5) is obtained on the basis of the three conditions that the object field section and the image field section are telecentric, that the magnification is 1, and that no image curvature is caused.

In the equation (5), s1 represents the working distance WD in the optical system. A working distance WD is a very important factor for an optical system and is required to exceed a given value according to the optical system. Therefore, once a working distance WD is given in designing of an optical system, then the focal length f1 of the thin lens 10 is determined from the equation (5).

Figure 3:
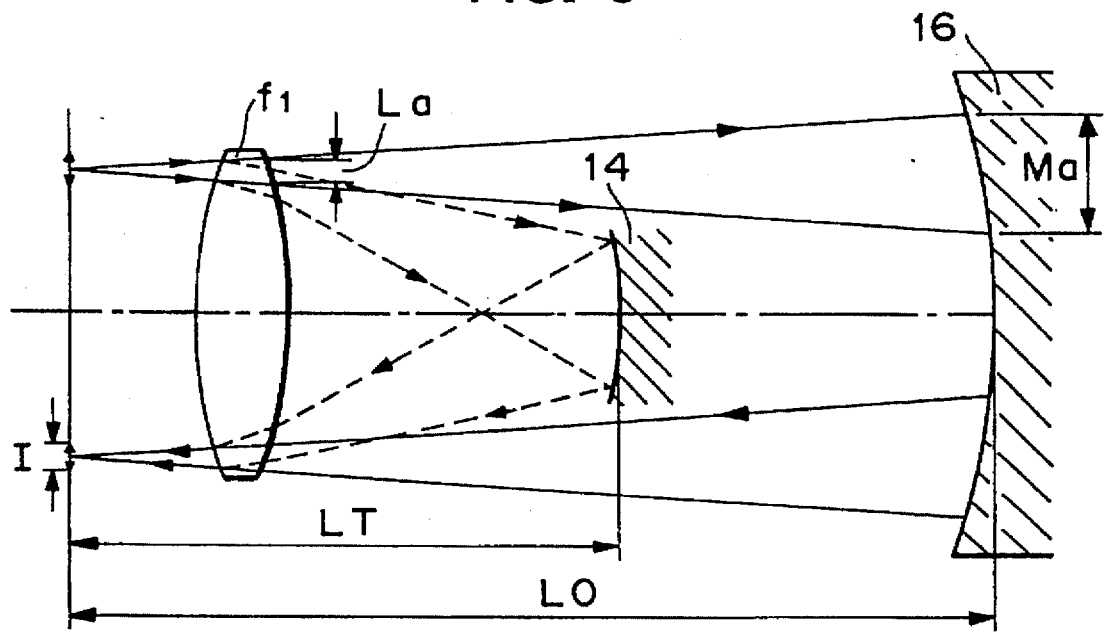
FIG. 3 is an optical diagram showing comparison between size of a basic form of the optical system of the present invention and size of a conventional optical system.

In the basic structure of the present invention, as shown in FIG. 3, the concave mirror 14 is miniaturized as compared with the concave mirror 16 for a conventional broad field catoptric system. Attendantly, it is seen that the first lens system 1 and second lens system 6 of the optical system according to the present invention are markedly miniaturized as compared with the concave mirror 16 which is a main component of a conventional broad field catoptric system.

According to the above description on the optical system shown in FIG. 2, it is found that only the field curvature can be corrected among aberrations in the optical system consisting of a lens and a spherical mirror. In the present invention, to attain a desired resolving power, Seidel's five aberrations and chromatic aberration are corrected as well as the field curvature in the aberration-free area of the optical system.

To carry out this, there may be mentioned possible three methods which comprises, in an optical system which satisfies the abovementioned equations (2) and (5), ① using an increased number of thin lenses instead of the thin lens 10 having a focal length of f1, and correcting aberrations of the optical system as a whole, ② using a first lens system having substantially the same power as the thin lens 10 and a second lens system having a power instead of the thin lens 10 having a focal length of f1, and correcting aberrations of the optical system as a whole, and ③ using a first lens system having substantially the same power as the thin lens 10 and a second lens system having no power instead of the thin lens 10 having a focal length of f1, and correcting aberrations of the optical system as a whole.

In the first method, due to the condition that both the object field section and the image field section of the optical system are telecentric, and the lens system consisting of the increased number of the lenses in the optical system, which corresponds to the thin lens 10, has an aperture larger than each of object and image regions which are aberration-free. Accordingly, this method is disadvantageous in that an increased number of lenses having a large aperture are used.

In the second method, the following three cases may be mentioned depending upon signs (positive and negative) of powers of the first and second lens systems.

|        | first lens system | second lens system |
|--------|-------------------|--------------------|
| case 1 | positive          | positive           |
| case 2 | positive          | negative           |
| case 3 | negative          | positive           |

In the case 3 where the first lens system has a negative power, the second lens system inevitably has a high power and an undesirably large aperture.

The optical system according to the present invention includes the cases 1 and 2, and in particular, provides a solution very close to one in the above third method ③. In other words, the optical system characteristically comprises a first lens-system having a positive power, a second lens-system having no substantial power, and a concave mirror.

Then, explanation will be given on the fact that a case where the second lens-system has a low power is optimum. Criteria for evaluating performance of a lens include degree of geometrical aberration, modulation transfer function (MTF) which are well-known. However, evaluation based on the degree of wavefront aberration which is intelligible is employed for the convenience of explanation. In the evaluation, as generally known, RMS (root mean square) value of the degree of wavefront aberration is used. With respect to the evaluation using RMS value, a region in which Malatial condition:

$RMS \leq 0.07 \lambda = (\lambda/14)$ ($\lambda$: wavelength)

is satisfied as a condition for a perfect lens is regarded as an aberration-free region.

Figure 1:
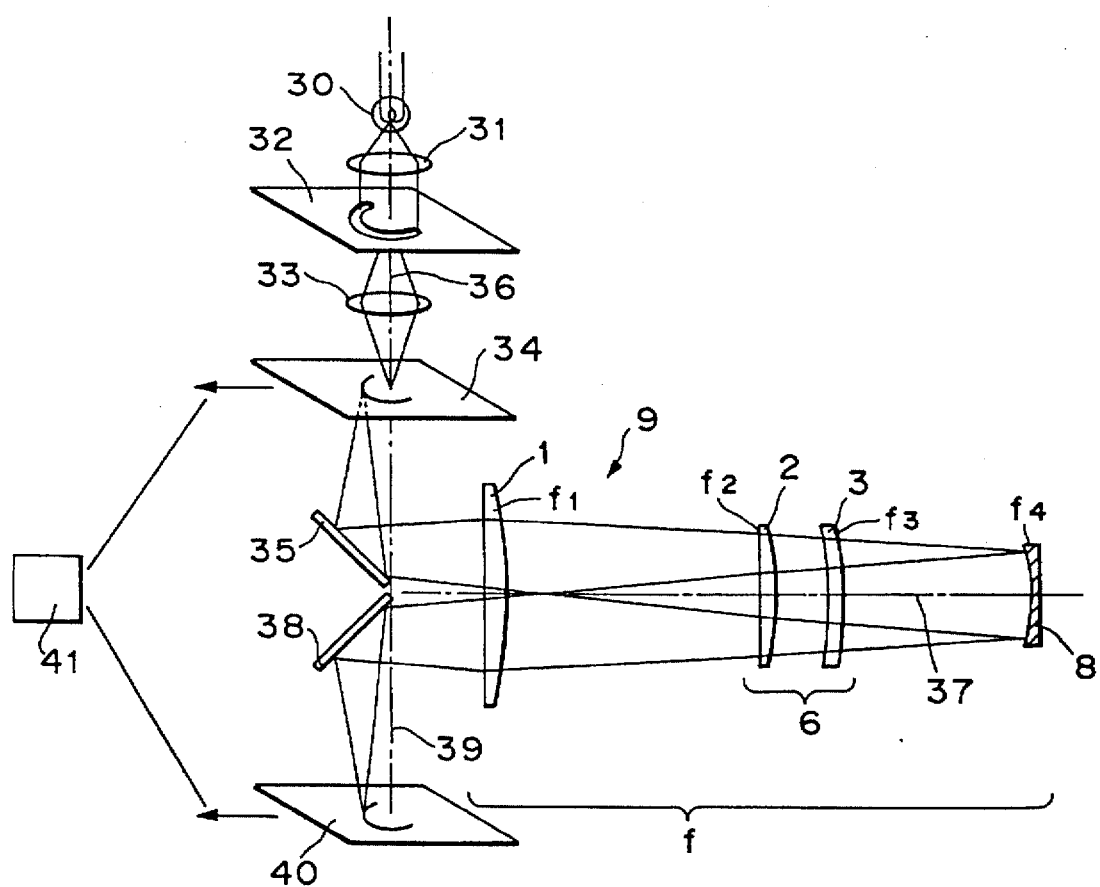
FIG. 1 is an optical diagram of the scanning projection optical device of the present invention.

As a model for the evaluation, one as shown in FIG. 1 is used which comprises a convex lens 2 and a concave lens 3 as the second lens-system 6 located away from the first lens-system to avoid use of any lens having an undesirably large aperture.

Figure 4:
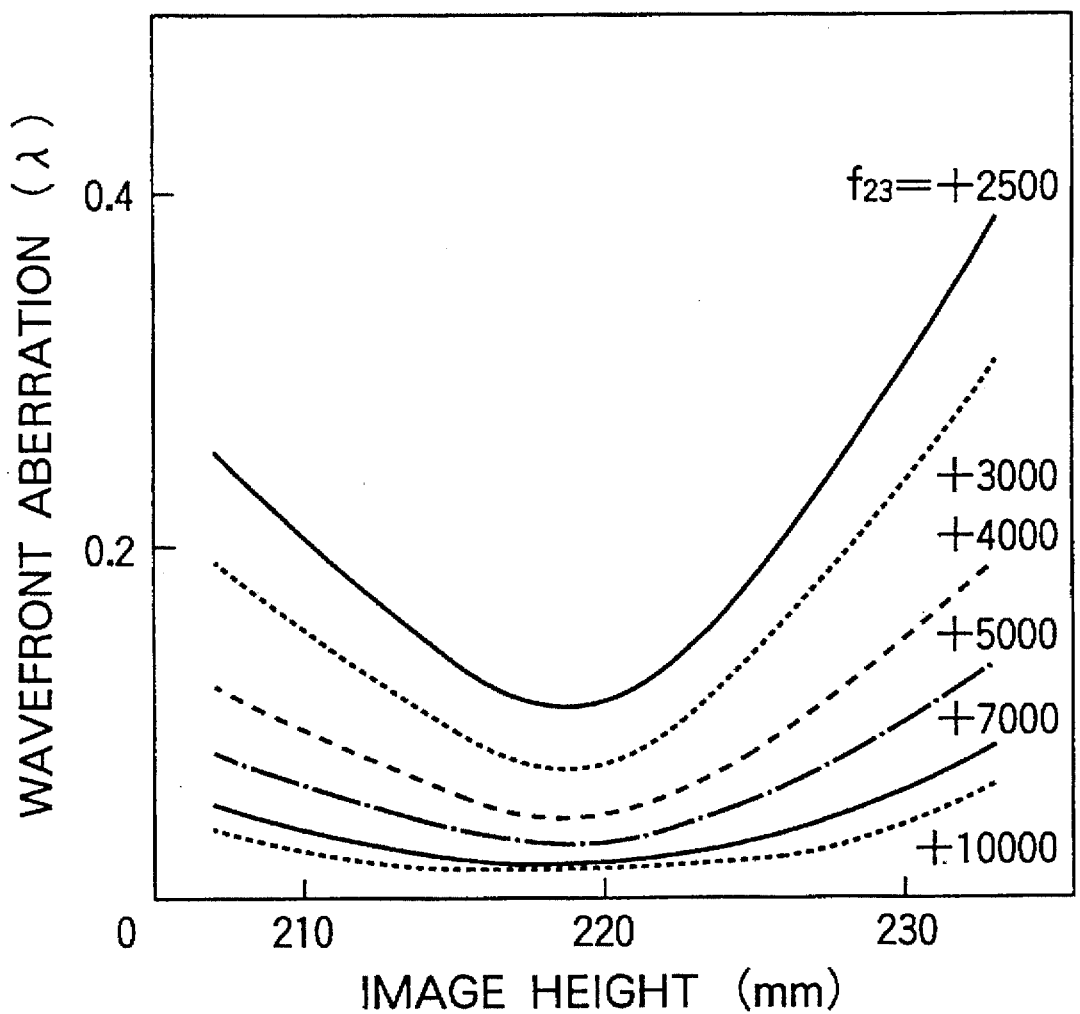
FIG. 4 a graphical representation showing curves of wavefront aberrations corresponding to different focal lengths of the second lens-system, in which each of the focal lengths has a positive value.
Figure 5:
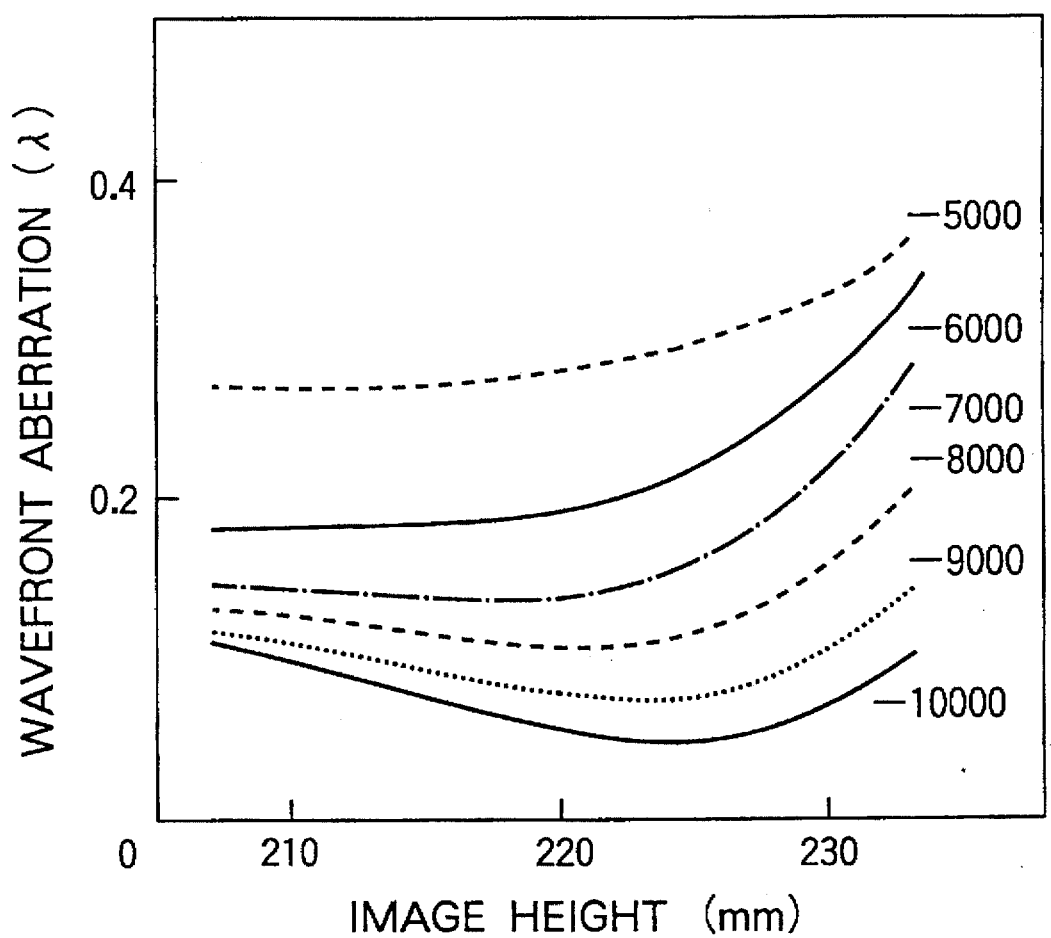
FIG. 5 graphical representation showing curves similar to those in FIG. 4, in which each of the focal lengths has a negative value.

A normal image height level of 220 mm is selected, and it is examined how broad extent can be regarded as a perfect lens around the normal level, namely, how large arc-width W can be attained. FIG. 4 shows curves of RMS values of wavefront aberrations, in which the focal length f23 of the second lens-system 6 is changed. The abscissa axis represents an image height and the ordinate axis represents RMS value of wavefront aberration. It is found that as the focal length f23 of the second lens-system 6 becomes short from 10,000 mm to 2,500 mm, the RMS value of the wavefront aberration becomes large. The minimum of the RMS value of the wavefront aberration is 0.07 $\lambda$ when the focal length f23 is 3,000 mm. Accordingly, when the focal length f23 is positive, it must be 3,000 mm or more. FIG. 5 is a graphical representation showing curves similar to those in FIG. 4, in which each of the focal lengths f23 of the second lens-system 6 has a negative value. As the focal length f23 of the second lens-system 6 becomes large from −10,000 mm to −5,000 mm, the RMS value of the wavefront aberration becomes large. The minimum of the RMS value of the wavefront aberration is 0.07 $\lambda$ when the focal length f23 is −9,000 mm. Accordingly, when the focal length f23 is negative, it must be −9,000 mm or less.

It is understood from the results of the above evaluation that in the optical system according to the present invention which comprises the first lens-system having a positive power, the second lens-system having no substantial power and the concave mirror; the power of the second lens-system, which is a reciprocal number of the focal length of the second lens-system, is required to satisfy the following condition:

$$-1.1 \times 10^{-4} < 1/f23 < 3.3 \times 10^{-4} \qquad (6)$$

In view of the fact that the second lens-system, which satisfies the above condition, exhibits no substantial power, the equation (1) should be satisfied substantially. In other words, the following relation:

$$f1/f4 \approx -2/n1$$

Should be satisfied between the focal lengths of the first lens-system and the concave mirror in accordance with the equation (1).

Taking into consideration the negligible power of the second lens-system, this relation is reformulated into the following relation:

$$-1.4 < f1/f4 < -1.0 \qquad (7)$$

When the second lens-system is composed of two lenses, it is apparent that the second lens-system is usually composed of one positive lens and one negative lens. Taking it into consideration that the second lens-system has no substantial power, it is readily understood that the following relation is satisfied.

$$|f2| \approx |f3|$$

EXAMPLE 1

The first embodiment of the projection optical device of the present invention is a circular scanner which scans an arc-shaped image. An optical system of the projection optical device 1 comprises a light source 30, a condenser lens 31 for collecting a beam from the light source 30, a diaphragm 32 having an arc-shaped aperture, a relay lens 33 for forming an image of the diaphragm aperture on an original mask sheet 34, and a first reflecting mirror 35, which are disposed on a first optical axis 36, as shown in FIG. 1. The beam from the light source 30 is collimated to illuminate the diaphragm 32 having the arc-shaped aperture around the first optical axis 36. The relay lens 33 forms an image of the diaphragm aperture on the original mask sheet 34.

On a second optical axis 37 which is the optical axis of the beam reflected from the first reflecting mirror 35 disposed on the first optical axis 36, a convex lens 1, a convex lens 2, a concave lens 3 and a concave mirror 8 comprising a catadioptric system 9 are disposed. The beam from the arc-shaped illuminated portion of he original mask sheet 34 is reflected by the first reflecting mirror 35, and caused to pass through a first lens-system composed of the convex lens 1 and a second lens-system composed of the convex lens 2 and concave lens 3, and then reflected by the concave mirror 8. The beam reflected from the concave mirror 8 is caused to repass through the second lens-system and the first lens-system, and then reflected by a second reflecting mirror 38.

On a third optical axis 39 which is the optical axis of the beam reflected from the second reflecting mirror 38 disposed on the second optical axis 37, a substrate 40 having photo-sensitivity is disposed. The beam reflected by the second reflecting mirror 38 forms an arc-shaped image around the third optical axis 39 on the substrate 40.

The original mask sheet 34 and the substrate 40 are synchronously moved by a driving device 41 in the direction perpendicular to the first optical axis 36 and the third optical axis 39, thereby effecting scanning projection-exposure in the area of the span of the arc x the distance of the movement.

In the above-described first embodiment of the scanning projection optical device, there are represented a focal length of the convex lens 1 by f1, a focal length of the convex lens 2 by f2, a focal length of the concave lens by f3, a focal length of the lens system 6 by f23, a focal length of the concave mirror 8 by f4, and the overall focal length by f. The catadioptric broad field exposure system is a symmetrical bilateral telecentric optical system in which the position of the concave mirror is a pupil position.

A gamma ray-wavelength, a magnification of 1, a NA of 0.12, and an arc-diameter of 220 mm are used.

When the following representations are made
r1–r7: curvature radius (mm)
d1–d6: lens thickness, or distance between lenses (mm)
n1–n3: refractive index of lens at a g ray-wavelength
$\upsilon$ e1–$\upsilon$ e3: Abbe constant of lens, these factors are specified as follows:

| | | |
|---|---|---|
| r1 = –4013.12 | d1 = 90 | n1 = 1.526214 |
| r2 = –655.92 | d2 = 700 | $\upsilon$ e1 = 63.9 |
| r3 = –14455.47 | d3 = 70 | n2 = 1.729443 |
| r4 = –1406.74 | d4 = 100 | $\upsilon$ e2 = 53.6 |
| r5 = –895.39 | d5 = 40 | n3 = 1.599644 |
| r6 = –3079.84 | d6 = 380 | $\upsilon$ e3 = 40.5 |
| r7 = –2365.56 | | | wherein the surfaces of r1 and r2 define the convex lens 1, the surfaces of r3 and r4 define the convex lens 2, the surfaces of r5 and r6 define the concave lens 3, and the surface of r7 defines the refractive surface of the concave mirror 8.

Figure 6:
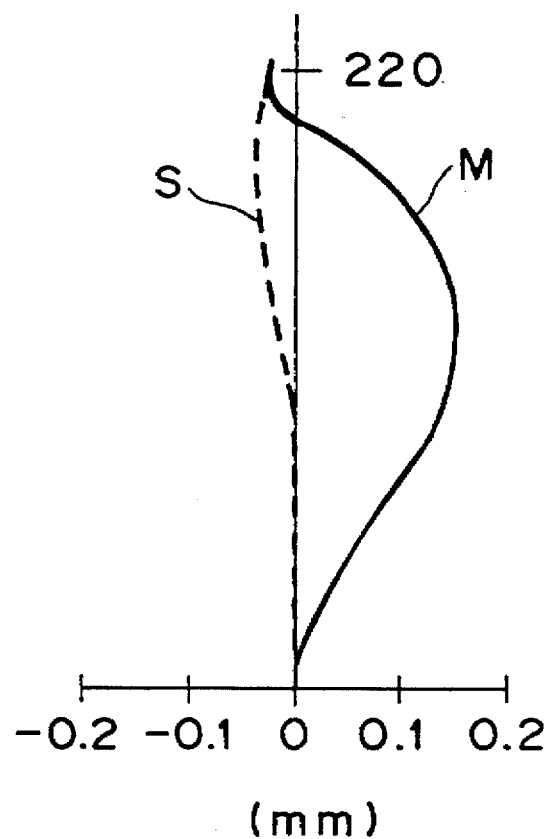
FIG. 6 is a graphical representation showing astigmatism in the first and second embodiments of the present invention.
Figure 7:
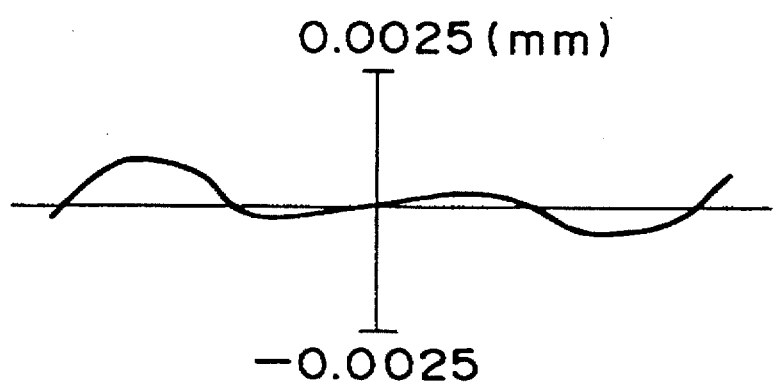
FIG. 7 is a graphical representation showing transverse aberration of the first embodiment of the present invention.

FIG. 6 shows astigmatism of the first embodiment of the scanning projection optical device. It is seen from FIG. 6 that, in the vicinity of the used image height of 220 mm, the astigmatism becomes 0 and hence the image plane is perpendicular to the optical axis without field tilt. FIG. 7 shows a transverse aberration curve at the image height of 200 mm. It is seen from FIG. 7 that the transverse aberration is also corrected.

Figure 8:
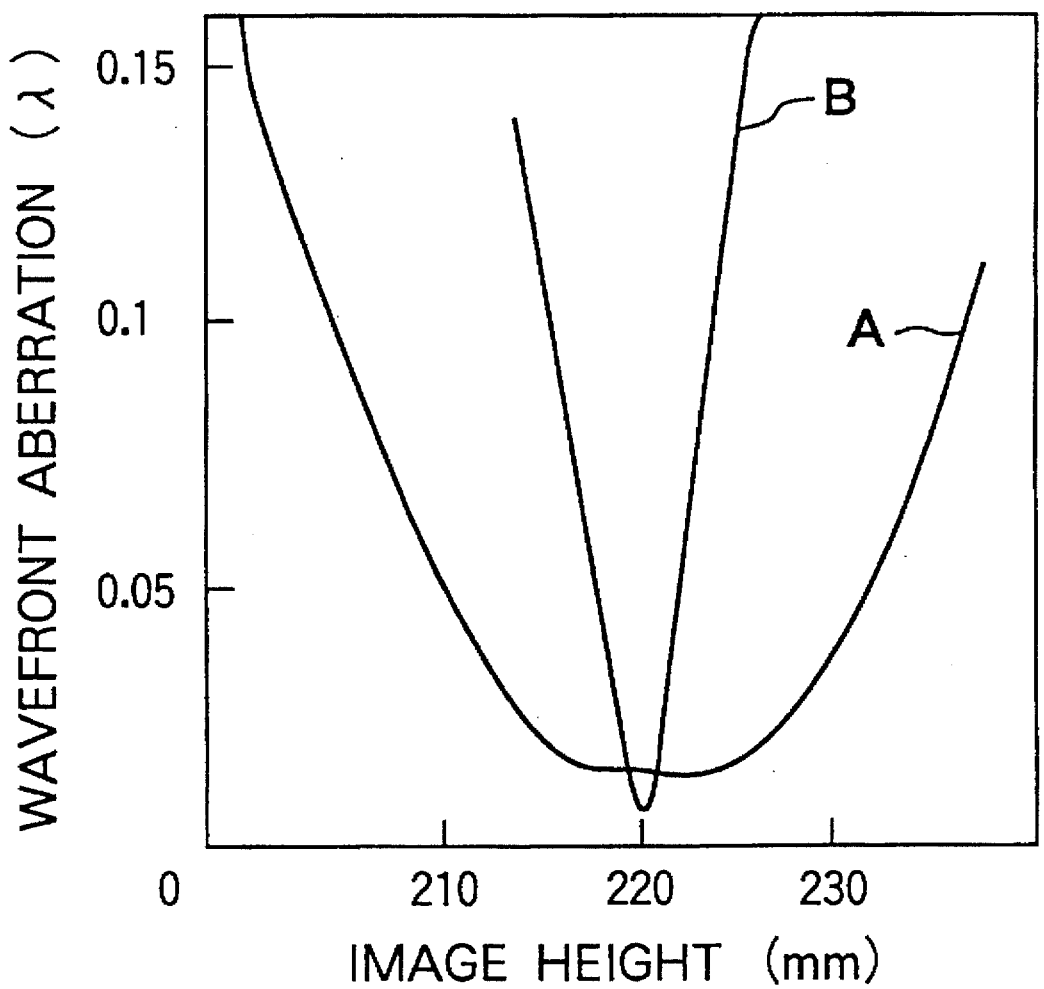
FIG. 8 is a graphical representation showing wavefront aberration of the first embodiment of the present invention, which varies depending upon image height.

To evaluate correction of the aberration, as shown in FIG. 8, the image height is plotted as abscissa and the RMS value as ordinate. In FIG. 8, the curve A shows the results on the present invention. When a region exhibiting an RMS value of wavefront aberration of 0.07 $\lambda$ or less is regarded as the aberration-free region, it corresponds to the range of 207 mm to 234 mm in terms of the image height. Accordingly, an arc-width of up to 27 mm is attainable.

Figure 11:
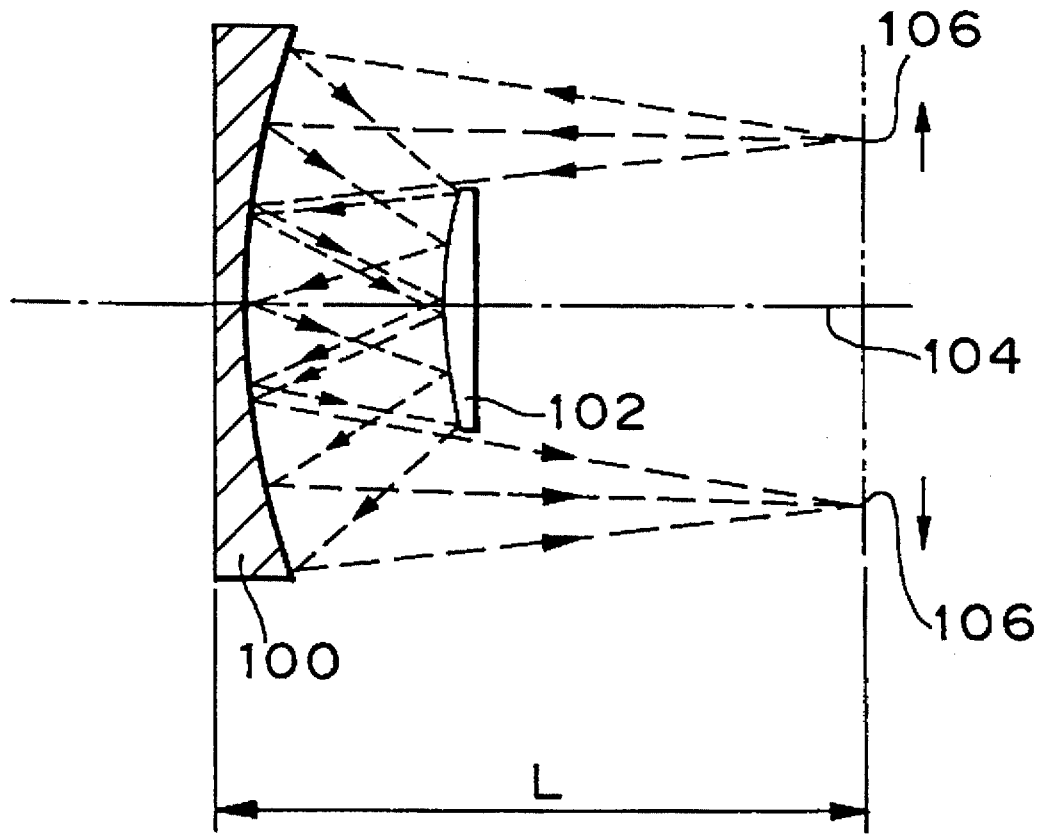
FIG. 11 is an optical diagram for illustrating principle of a conventional scanning projection optical system.
Figure 12:
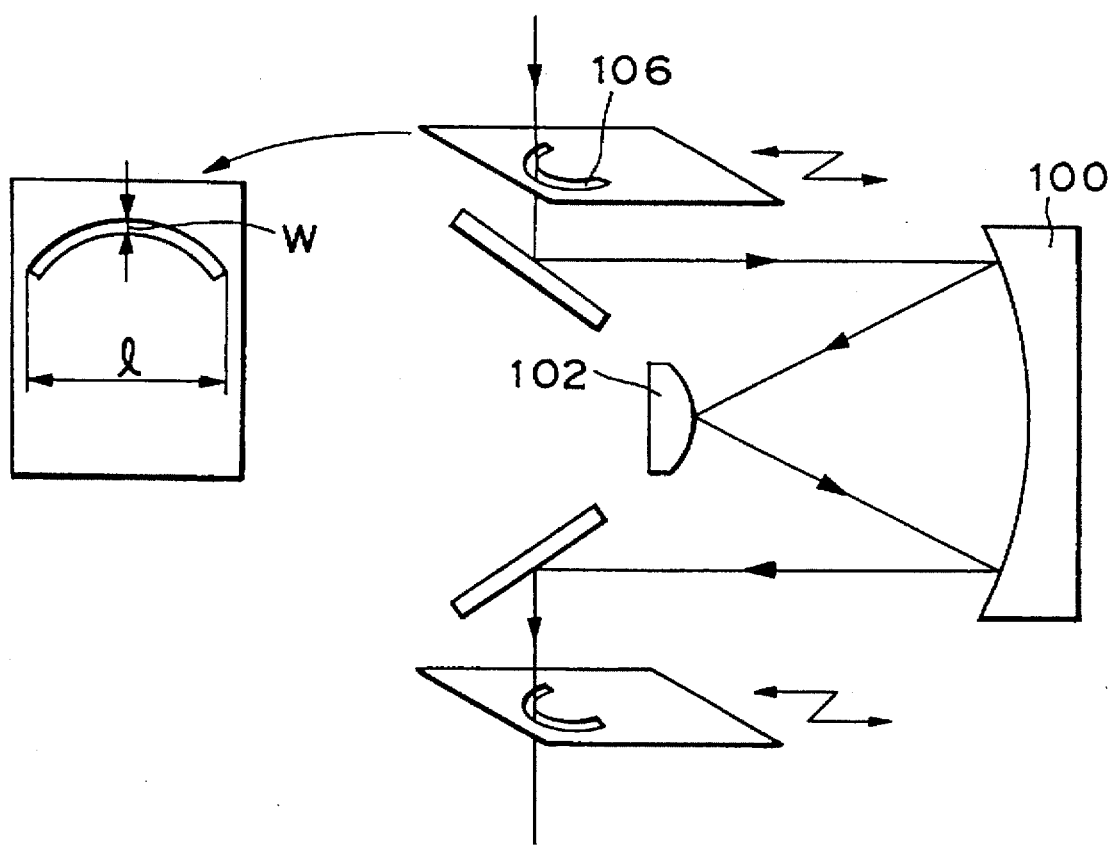
FIG. 12 is an optical diagram illustrating structure of the conventional scanning projection optical system.
Figure 13:
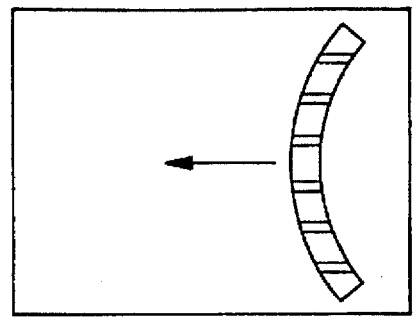
FIG. 13 is a illustrative diagram of a mode for scanning of the conventional scanning projection optical system.
Figure 14:
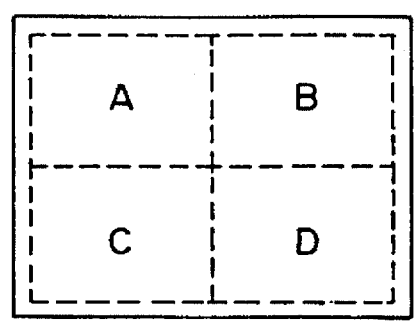
FIG. 14 is an illustration of a quartered conventional stepper.
Figure 15:
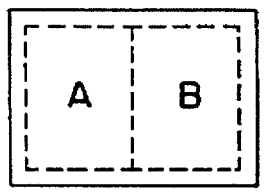
FIG. 15 is an illustration of a bisected conventional stepper.

On the other hand, in FIG. 8 by the curve B, there is shown aberration caused by an optical system using a conventional mode (catoptric mode) which is so constructed as to have the same full length as that of the first embodiment of the present invention, namely, one comprising two mirrors, as shown by a line B in FIG. 11, one of which is a concave mirror having a curvature radius of 2,000 mm. According to the conventional mode, when a region exhibiting an RMS value of wavefront aberration of 0.07 $\lambda$ or less is regarded as the aberration-free region, it has a width of 6 mm. This is far inferior to the result of the first embodiment. As opposed to the optical system using the conventional mode, the scanning projection optical system comprises a convex lens 1 having a focal length of f1, a second lens-system 6 having a focal length of f23 which is composed of a convex lens having a focal length of f2 and a concave lens having a focal length of f3, and a concave mirror 8 having a focal length of f4, and the first embodiment has an overall focal length of f. The catadioptric broad field exposure system is a symmetrical bilateral telecentric optical system in which the position of the concave mirror is a pupil position. An arc-shaped region centering around the optical axis is illuminated as a projective object, and an arc-shaped region substantially centering around the optical axis is used as an image.

It is, therefore, understood that if the optical system using a conventional mode were used to attain substantially the same width of an aberration-free region as that attained by the first embodiment, the concave mirror would be required to have a curvature radius of 3,000 to 4,000 mm, and consequently, the conventional optical device would inevitably have an undesirably large size.

Incidentally, in the first embodiment, $1/f23=1.63\times 10^{-5}$
$f1/f4=-1.248$,
$f1=1,476$ mm,
$f2=2,132$ mm,
$f3-2,120$ mm,
$f23=61,456$ mm,
$f4=-1,183$ mm, and
$f=-5,043$ mm.

From this, the relations (6), (7) and (8) are found to be satisfied.

EXAMPLE 2

A gamma ray-wavelength, a magnification of 1, a NA of 0.12, and an arc-diameter of 220 mm are used.

The same representations as in Example 1 are made.
r1–r7: curvature radius (mm)
d1–d6: lens thickness, or distance between lenses (mm)
n1–n3: refractive index of lens at a g ray-wavelength
$\upsilon$ e1–$\upsilon$ e3: Abbe constant of lens
Then, these factors are specified as follows:

| r1 = −2142.44 | d1 = 90  | n1 = 1.526214 |
|---|---|---|
| r2 = −590.59  | d2 = 720 | $\upsilon$ e1 = 63.9 |
| r3 = ∞        | d3 = 80  | n2 = 1.526214 |
| r4 = −1663.10 | d4 = 120 | $\upsilon$ e2 = 63.9 |
| r5 = −825.35  | d5 = 60  | n3 = 1.584217 |
| r6 = −1535.12 | d6 = 330 | $\upsilon$ e3 = 42.5 |
| r7 = −2310.14.|          |               |

Figure 9:
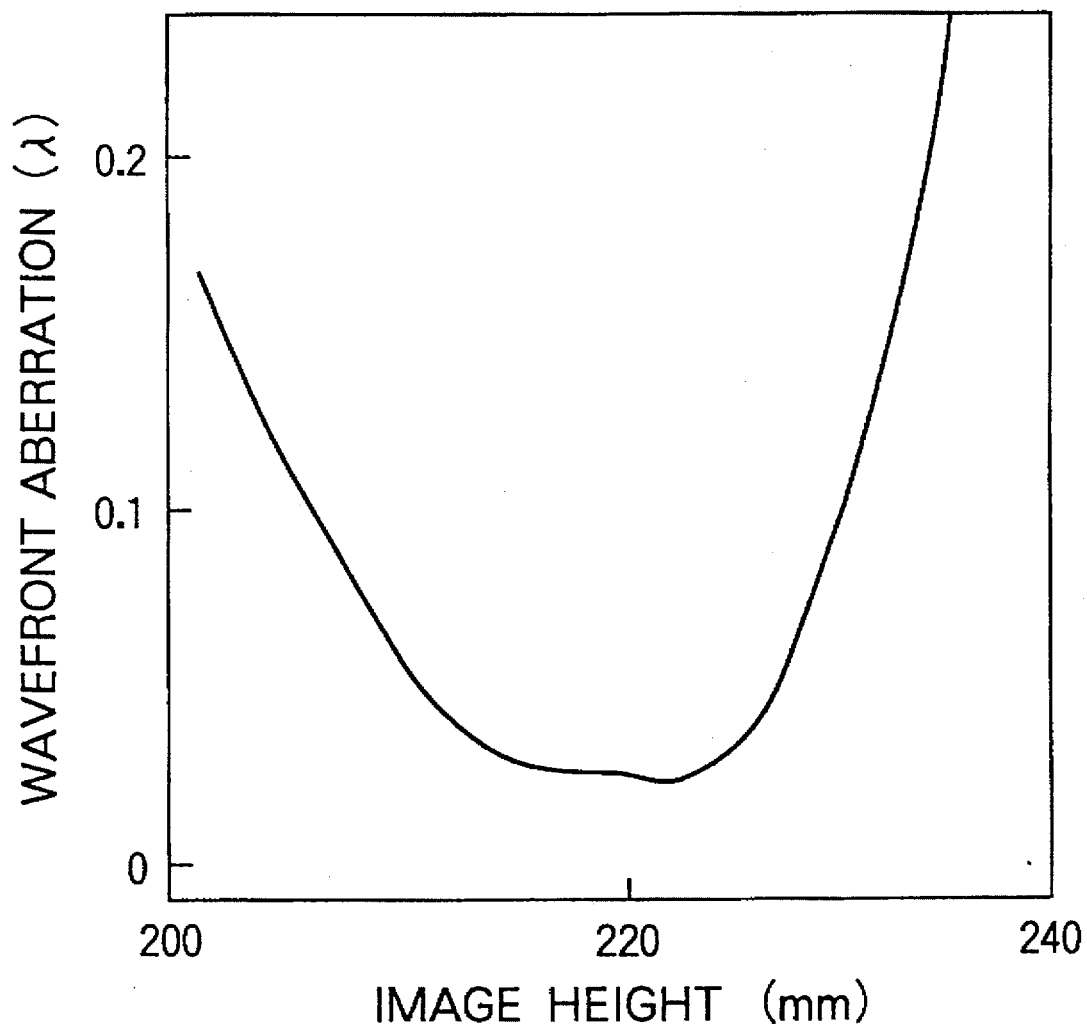
FIG. 9 is a graphical representation showing wavefront aberration of the second embodiment of the present invention, which varies depending upon image height.

The astigmatism curve of the second embodiment is substantially the same as that of the first embodiment shown in FIG. 6. In the vicinity of the used image height of 220 mm, the astigmatism becomes 0 and hence the image plane is perpendicular to the optical axis without field tilt. FIG. 9 is a graph showing a curve of the RMS value of the wavefront aberration caused by the second embodiment. It is understood from this graph that a sufficient aberration-free region (arc-width) can be attained.

Incidentally, in the second embodiment, $1/f23=6.81\times 10^{-6}$,
$f1/f4=-1.315$,
$f1=1,519$ mm,
$f2=3,161$ mm,
$f3=-4,154$ mm,
$f23=146,840$ mm,
$f4=-1,155$ nm, and
$f=-4,068$ mm.

Also in the second embodiment, the relations (6), (7) and (8) are found to be satisfied.

In the above-described first and second embodiments,
NA=0.12,
image height=220 mm, and
width of aberration-free region=27 mm.

The resolving power is $\pi/2NA=1.8$ μm. With respect to the field size, a span of the arc of 400 mm is attainable. Therefore, when a scanning length ranging over 600 mm is employed, it is possible to carry out continuous exposure covering a field as broad as 400 mm×600 mm. The field of 400 mm×600 mm enables 4 sheets, 2 sheets, and 1 sheet to be continuously exposed in terms of 10.4-inch mask, 16-inch mask, and 23-inch mask, respectively.

EXAMPLE 3

A gamma ray-wavelength, a magnification of 1, a NA of 0.12, and an arc-diameter of 220 mm are used.

The same representations as in Example 1 are made.
r1–r7: curvature radius (mm)
d1–d6: lens thickness, or distance between lenses (mm)
n1–n3: refractive index of lens at a g ray-wavelength
e1–e3: Abbe constant of lens
Then, these factors are specified as follows:

| r1 = −2949.42 | d1 = 95  | n1 = 1.526214 |
|---|---|---|
| r2 = −588.29  | d2 = 608 | $\upsilon$ e1 = 63.9 |
| r3 = −4822.14 | d3 = 70  | n2 = 1.526214 |
| r4 = −1471.79 | d4 = 251 | $\upsilon$ e2 = 63.9 |
| r5 = −744.07  | d5 = 62  | n3 = 1.534790 |
| r6 = −1173.27 | d6 = 267 | $\upsilon$ e3 = 40.5 |
| r7 = −2099.11.|          |               |

Figure 10:
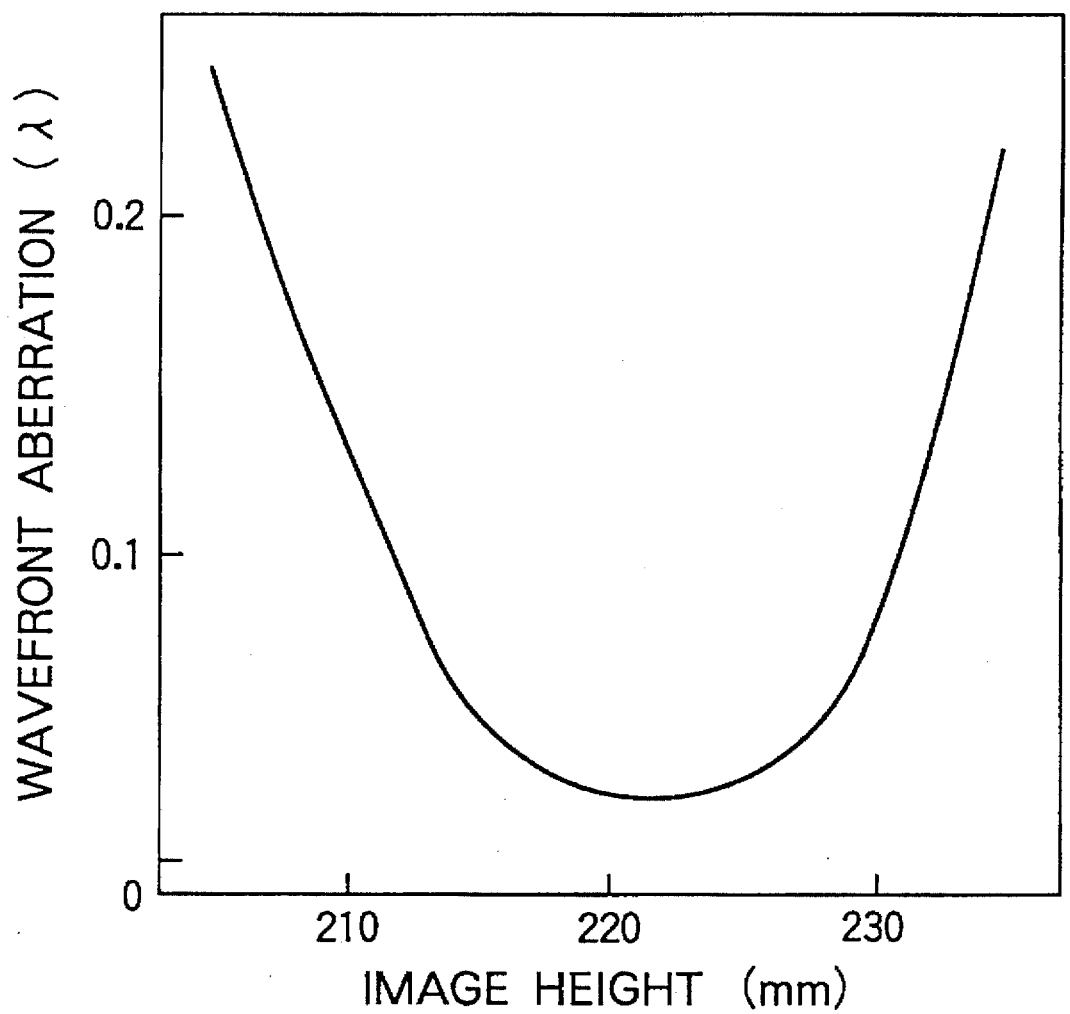
FIG. 10 is a graphical representation showing wavefront aberration of the third embodiment of the present invention, which varies depending upon image height.

The astigmatism curve of the third embodiment is substantially the same as that of the first embodiment shown in FIG. 6. It is seen that in the vicinity of the used image height of 220 mm, the astigmatism becomes 0 and hence the image plane is perpendicular to the optical axis without field tilt. FIG. 10 is a graph showing a curve of the RMS value of the wavefront aberration caused by the third embodiment. It is understood from this graph that a sufficient aberration-free region (arc-width) can be attained.

Incidentally, in the third embodiment, $1/f23=-1.72\times 10^{-5}$,
$f1/f4=-1.31$,
$f1=1,376$ mm,
$f2=3,992$ mm,
$f3=-3,586$ mm,
$f23=-58,165$ mm,
$f4=-1,050$ mm, and
$f=-6,274$ mm.

Also in the third embodiment, the relations (6), (7) and (8) are found to be satisfied.

In the above-described third embodiment,
NA=0.12,
image height=220 mm, and
width of aberration-free region=16.3 mm.

The width of the aberration-free region is slightly narrow as compared with those in the first and second embodiment; however, other conditions are comparable. It is, therefore, possible to carry out continuous exposure covering substantially the same field size as previously mentioned with respect to the first and second embodiments.

According to the present invention, there is provided a scanning projection optical device which can be constructed using relatively small optical members, which employs a catadioptric system that is advantageous to attain a high NA, and which has arc-shaped object and image regions located out of an optical axis and a projecting magnification of 1.

According further to the present invention, there is provided a scanning projection optical device which is capable of readily correcting Seidel's five aberrations and chromatic aberration, which can advantageously be used for exposure of, e.g., a 20-inch flat panel display that requires a resolving power of 278 mm, i.e., a resolving power as high as a several μm.

What is claimed is:

1. A scanning projection optical device, which projects an object by scanning with a predetermined scanning width, comprising:
    an illuminator for illuminating the object upon an arc-shaped region, a catadioptric system for forming on an image plane an image of the object illuminated on the arc-shaped region by the illuminator, a photosensitive member located in the image plane, and a driving device for relatively moving the object and the photosensitive member relative to both the illuminator and the catadioptric system in the direction perpendicular to the direction of the illumination, wherein said catadioptric system is an optical system telecentric in both object-and image-field sections, and has a first, positive power lens-system, a second, substantially non-power lens-system, and a concave mirror;

said first, positive power lens-system and said concave mirror cooperatively satisfy a Petzval condition to correct field curvature; and without impairing the Petzval condition satisfied by the first lens-system and the concave mirror, said second lens-system corrects aberration of the arc-shaped region centering around the optical axis.

2. The scanning projection optical system according to claim 1, wherein in said catadioptric system, when the second lens system has a focal length of f23, the focal length satisfies the following relation:

$-1.1 \times 10^{-4} < f23 < 3.3 \times 10^{-4}$.

3. The scanning projection optical system according to claim 1, wherein in said catadioptric system, when the first lens-system has a focal length of f1 and the concave mirror has a focal length of f4, the following relation is satisfied:

$-1.4 < f1/f4 < -1.0$.

4. The scanning projection optical system according to claim 1, wherein in said catadioptric system, the second lens-system is composed of a group of two lenses, one of said lenses having a positive power and the other having a negative power; and wherein when the lenses have focal lengths of f2 and f3, the following relation is satisfied:

$|f2| \approx |f3|$.

* * * * *